United States Patent
Iino et al.

(10) Patent No.: US 7,292,474 B2
(45) Date of Patent: Nov. 6, 2007

(54) SEMICONDUCTOR INTEGRATED CIRCUIT DEVICE

(75) Inventors: Naohisa Iino, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 11/443,119

(22) Filed: May 31, 2006

(65) Prior Publication Data
US 2007/0180219 A1    Aug. 2, 2007

(30) Foreign Application Priority Data
Jan. 31, 2006    (JP) ............... 2006-023864

(51) Int. Cl.
*G11C 11/34*    (2006.01)
*G11C 16/04*    (2006.01)

(52) U.S. Cl. ............... 365/185.03; 365/185.12; 365/185.17; 365/185.25

(58) Field of Classification Search ........... 365/185.03, 365/185.05, 185.11, 185.12, 185.17, 185.25
See application file for complete search history.

(56) References Cited

U.S. PATENT DOCUMENTS

| | | | |
|---|---|---|---|
| 6,314,026 B1 | 11/2001 | Satoh et al. | |
| 6,807,104 B2 | 10/2004 | Arai et al. | |
| 6,937,515 B2 * | 8/2005 | Sudo et al. | 365/185.12 |
| 7,016,226 B2 | 3/2006 | Shibata et al. | |
| 7,027,329 B2 | 4/2006 | Sakuma et al. | |
| 7,038,946 B2 * | 5/2006 | Hosono et al. | 365/185.17 |
| 7,120,052 B2 * | 10/2006 | Shibata et al. | 365/185.03 |

FOREIGN PATENT DOCUMENTS

| | | |
|---|---|---|
| JP | 2004-192789 | 7/2004 |
| JP | 2005-243205 | 9/2005 |

OTHER PUBLICATIONS

U.S. Appl. No. 11/325,917 filed Jan. 4, 2006, Shibata et al.

* cited by examiner

*Primary Examiner*—Richard T. Elms
*Assistant Examiner*—Toan Le
(74) *Attorney, Agent, or Firm*—Oblon, Spivak, McClelland, Maier & Neustadt, P.C.

(57) ABSTRACT

A semiconductor integrated circuit device has a memory cell array including a plurality of pages and a page buffer. Each of the plurality of pages includes a user region and a page flag region in which page flag data indicative of a current state of a corresponding page is written. The page buffer includes a user page buffer section which temporarily holds the user data and a page flag page buffer section which temporarily holds the page flag data. The page flag data is recorded in the form of two levels in the non-volatile semiconductor memory cell arranged in the page flag region. The user data is recorded in the form of multilevel in the non-volatile semiconductor memory cell arranged in the user region.

17 Claims, 10 Drawing Sheets

Writing of lower-order page data

FIG. 5

After writing lower-order page data in adjoining cell

FIG. 6

Writing of upper-order page data

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-023864, filed Jan. 31, 2006, the entire contents of which are incorporated herein by reference.

BACKGROUND OF THE INVENTION

1. Field of the Invention

The present invention relates to a semiconductor integrated circuit device, and more particularly to a semiconductor integrated circuit device including a non-volatile semiconductor memory in which data are rewritable.

2. Description of the Related Art

A storage capacity of a non-volatile semiconductor memory in which data are rewritable, e.g., a NAND type flash memory tends to be further increased.

When miniaturization of a memory cell advances with an increase in storage capacity, there has emerged a phenomenon which has conventionally rarely appeared, e.g., a phenomenon such as a fluctuation in threshold value due to potentials of floating gates of cells adjacent to each other. This fluctuation in threshold value is called the proximity effect.

The proximity effect fluctuates a threshold value of a memory cell in which data has been already written. This becomes a problem when narrowing a threshold distribution width. In order to narrow the threshold distribution width, correcting a fluctuation in threshold value due to the proximity effect can suffice. As this correction technique, an improvement in data writing method has been sought. A known example of an improved data writing method, there is Jpn. Pat. Appln. KOKAI Publication No. 2005-243205.

However, the improved data writing method requires page flag data indicative of a current state of a page. Reading page flag data is an operation which is added to a writing sequence. Reading page flag data obstructs an increase in speed of a write operation.

BRIEF SUMMARY OF THE INVENTION

A semiconductor integrated circuit device according to an aspect of the present invention comprises: a memory cell array which has a non-volatile semiconductor memory arranged therein and includes a plurality of pages, each of the plurality of pages including a user region in which data can be rewritten by a user and a page flag region in which page flag data indicative of a current state of a corresponding page is written;

a page buffer which temporarily holds data in units of page which is read from the memory cell array and data in units of page which is written in the memory cell array, the page buffer including a user page buffer section which temporarily holds user data which is written in the user region and read from the user region and a page flag page buffer section which temporarily holds page flag data which is written in the page flag region and read from the page flag region, the page flag data being recorded in the form of two levels in the non-volatile semiconductor memory cell arranged in the page flag region, the user data being recorded in the form of mulutilevel in the non-volatile semiconductor memory cell arranged in the user region; and a plurality of bit lines which electrically connect the page buffer with the memory cell array.

DETAILED DESCRIPTION OF THE INVENTION

Prior to an explanation of embodiments, the proximity effect and a correction technique which corrects the proximity effect will be briefly described.

Figure 1A:
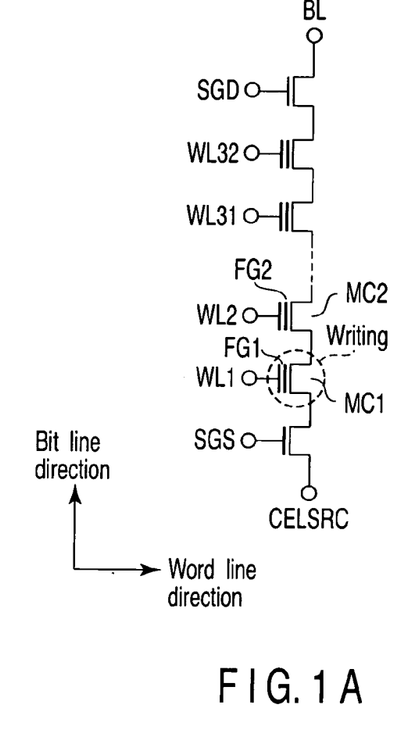
FIGS. 1A and 1B are views showing data writing with respect to a memory cell.
Figure 1B:
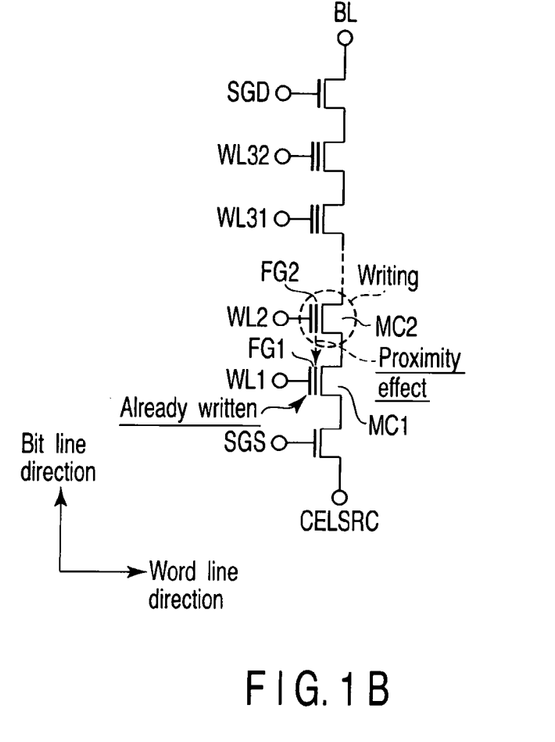

Data is written page by page in a non-volatile semiconductor memory, e.g., a NAND type flash memory. That is, when writing in one page is finished, the processing advances to writing in the next page. It is general for pages to be set in units of word lines. For example, when data is written in a memory cell MC1 connected with a word line WL1 (see FIG. 1A), data is then written in a memory cell MC2 connected with a word line WL2 (see FIG. 1B).

Figure 2:
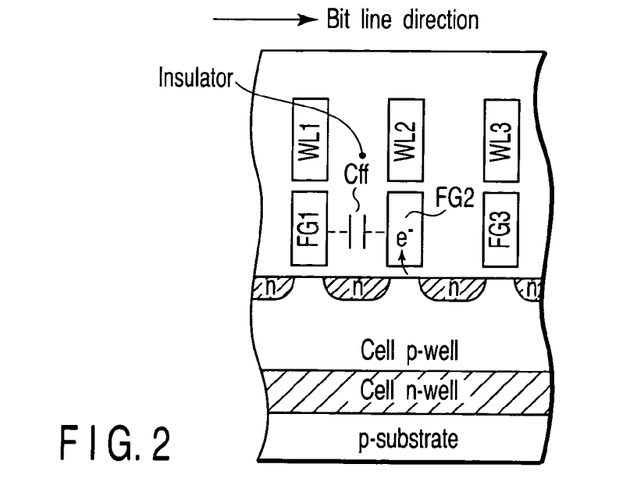
FIG. 2 is a cross-sectional view taken along a bit line direction of memory cells.
Figure 3A:
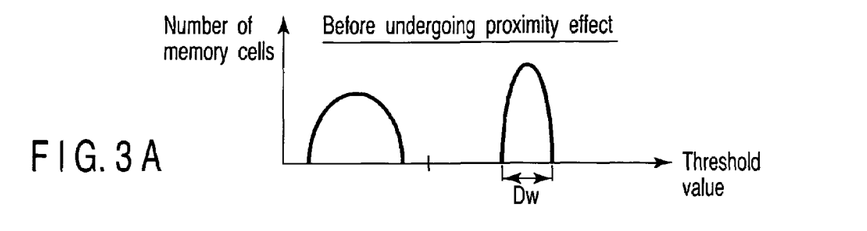
FIG. 3A is a view showing threshold distributions before undergoing a proximity effect.

Here, it is assumed that data "0" is written in the memory cell MC2. When the data "0" is written, an electron e- is injected into an electric charge layer of the memory cell MC2, e.g., a floating gate FG2, and a potential of the floating gate FG2 is reduced. The floating gate FG2 is adjacent to a floating gate FG1 of the memory cell MC1 through an insulator (see FIG. 2). The floating gate FG2 is coupled with the floating gate FG1 of the memory cell MC1 through a parasitic capacitance Cff. When the potential of the floating gate FG2 is reduced, the floating gate FG1 is capacitance-coupled with the floating gate FG2, and the potential of the floating gate FG1 is thereby lowered. Data has been already written in the memory cell MC1. The fact that the potential of the floating gate FG1 of the memory cell MC1 in which data has been already written is lowered means that a threshold value Vth of the memory cell MC1 in which data has been already written is changed. This is the proximity effect. FIG. 3A shows a threshold distribution Dw of a memory cell before undergoing the proximity effect, and FIG. 3B shows a threshold distribution Dw' after undergoing the proximity effect.

Figure 3B:
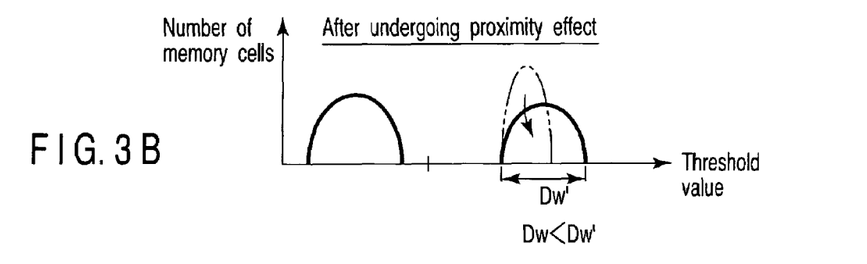
FIG. 3B is a view showing threshold distributions after undergoing the proximity effect.

As shown in FIGS. 3A and 3B, the proximity effect increases the threshold distribution width Dw of a memory cell in which data has been already written to the distribution width Dw'. This makes it difficult to control the threshold distribution within a target range.

Figure 4:
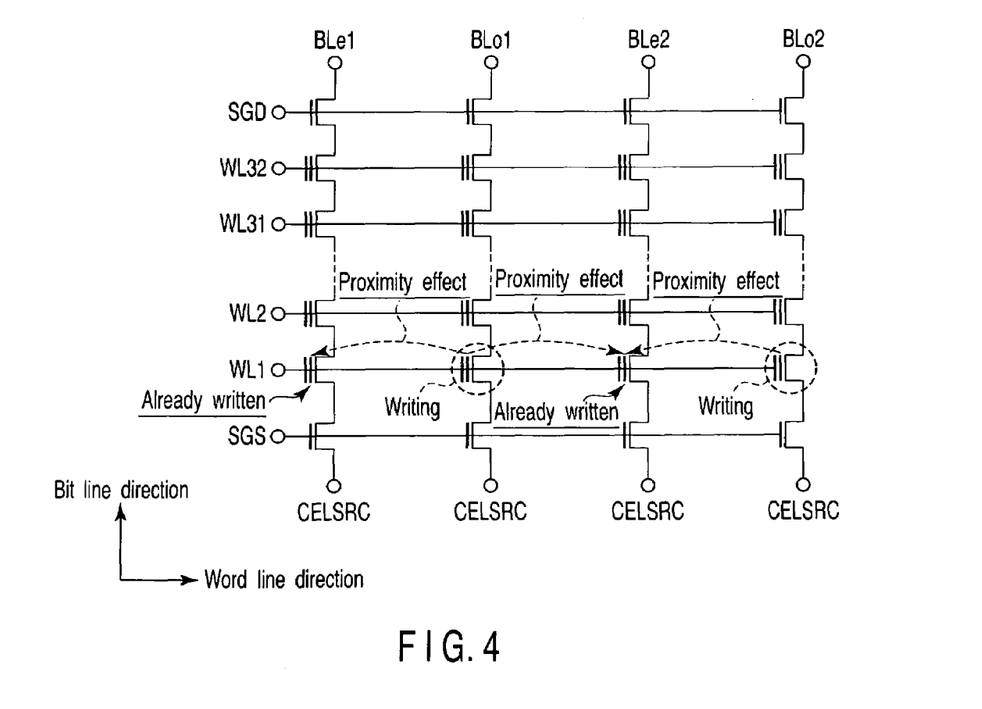
FIG. 4 is a view showing data writing with respect to memory cells.

The proximity effect occurs not only between memory cells which are adjacent to each other in a bit line direction but also between memory cells which are adjacent to each other in a word line direction. For example, this is a NAND type flash memory in which data is alternately written in even-numbered bit lines BLe and odd-numbered bit lines BLo (see FIG. 4). In the NAND type flash memory adopting this mode, the proximity effect occurs between memory cells adjacent to each other in a word line direction.

With the miniaturization of memory cells, so called multivaluing, which stores three or more levels in one memory cell, is making progress. A threshold distribution width of a multivalued NAND type flash memory is smaller than that in a two-valued NAND type flash memory. The two-valued NAND type flash memory is affected by the proximity effect, but the multivalued NAND type flash memory is more prominently affected by the proximity effect. For example, in a four-valued NAND type flash memory, three threshold distributions are formed between a threshold distribution which is in an erasing state and an intermediate voltage Vpass. Each threshold distribution width is narrow. When memory cells are affected by the proximity effect, the threshold distributions may possibly overlap each other. When the threshold distributions overlap each other, data cannot be correctly stored. In order to narrow each threshold distribution width, correcting a fluctuation in threshold value due to the proximity effect can suffice. As this correction technique, the following two writing methods are considered.

(LM Writing Method)

Figure 5:
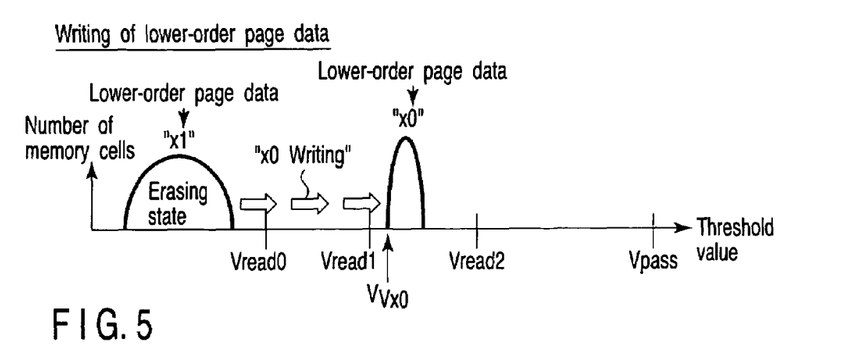
FIG. 5 is a view showing a change in a threshold distribution in an LM writing method.
Figure 6:
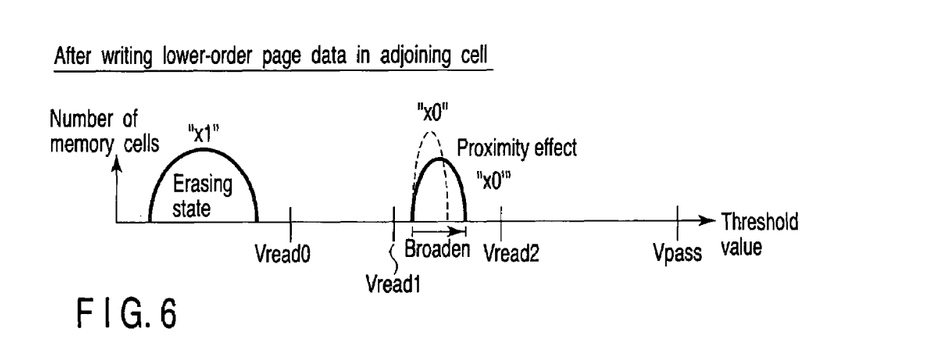
FIG. 6 is a view showing a change in a threshold distribution in the LM writing method.
Figure 7:
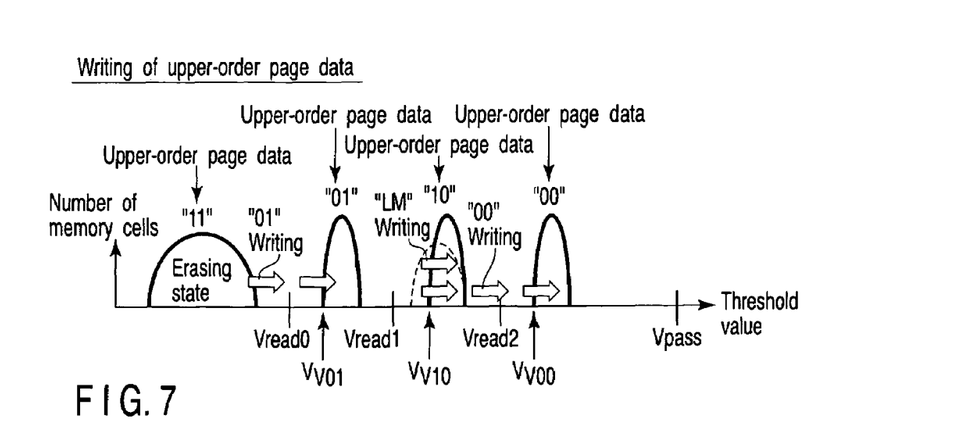
FIG. 7 is a view showing a change in a threshold distribution in the LM writing method.

FIGS. 5 to 7 are views showing a first correction technique, and illustrate how each threshold distribution changes. In the first correction technique, a multivalued NAND type flash memory, e.g., a four-valued NAND type flash memory is shown. There are four threshold distributions "11", "01", "10" and "00" in ascending order. "11" is indicative of an erasing state. These two-bit data "11" to "00" are divided into upper-order page data and lower-order page data. In this example, the upper-order page data is allocated to a upper-order bit, and the lower-order page data is allocated to a lower-order bit.

First, the lower-order page data is written. As shown in FIG. 5, when the lower-order page data is "1", a threshold value is not shifted, and an erasing state "x1" is maintained.

When the lower-order page data is "0", the threshold value is shifted. In this example, an electron is injected into a floating gate of a memory cell which is in the erasing state "x1", whereby the threshold value of the memory cell is changed to a writing state "x0" from the erasing state "x1" ("x0" writing).

Then, the lower-order page data is written in an adjoining cell. At this time, as shown in FIG. 6, the proximity effect occurs in the memory cell in which the lower-order page data has been precedently written. The writing state "x0" is changed to a writing state "x0'". A threshold distribution width expands to increase a threshold value.

Subsequently, the upper-order page data is written in the memory cell in which the proximity effect has occurred. As shown in FIG. 7, when both the upper-order page data and the lower-order page data are "1", the erasing state "11" is maintained without shifting the threshold value.

When the upper-order page data is "0" and the lower-order page data is "1", an electron is injected into a floating gate of a memory cell which is in the erasing state "11", whereby a threshold value of the memory cell is increased from the erasing state "11" to a writing state "01" ("01" writing). The writing state "01" in this example exists between the erasing state "11" and the writing state "10".

When the upper-order page data is "1" and the lower-order page data is "0", an electron is injected into a floating gate of a memory cell which is in the writing state "x0'", whereby a threshold value of the memory cell is increased from the writing state "x0'" to a writing state "10" (LM writing). This writing is not a mode adopted in a typical multivalued flash memory. This is newly added writing in order to correct the proximity effect. This writing again narrows the increased threshold distribution width. That is, it corrects a fluctuation in threshold due to the proximity effect. The writing state "10" in this example exists between the writing state "01" and the writing state "00".

When both the upper-order page data and the lower-order page data are "0", an electron is injected into a floating gate of a memory cell which is in the writing state "x0'", whereby a threshold value of the memory cell is increased from the writing state "x0'" to a writing state "00" ("00" writing).

The first correction technique shown in FIGS. 5 to 7 will be referred to as an LM writing method in this specification.

(Additional Writing Method)

FIGS. 8 to 11 are views showing a second correction technique, and illustrate how each threshold distribution changes. Like the first correction technique, in the second correction technique, a multivalued NAND type flash memory, e.g., a four-valued NAND type flash memory is shown. There are four threshold distributions "11", "10", "01" and "00" in ascending order. "11" is indicative of an erasing state. These two-bit data "11" to "00" are divided into upper-order page data and lower-order page data. In this example, the upper-order page data is allocated to a upper-order bit, and the lower-order page data is allocated to a lower-order bit.

Figure 8:
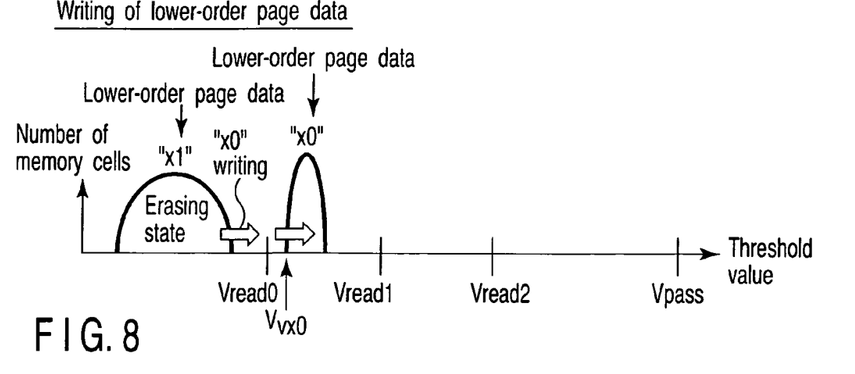
FIG. 8 is a view showing a change in a threshold distribution in an additional writing method.

First, the lower-order page data is written. As shown in FIG. 8, when the lower-order page data is "1", a threshold value is not shifted, and an erasing state "x1" is maintained.

When the lower-order page data is "0", a threshold value is shifted. In this example, an electron is injected into a floating gate of a memory cell which is in the erasing state "x1", whereby a threshold value of the memory cell is increased from the erasing state "x1" to a writing state "x0" ("x0" writing).

Figure 9:
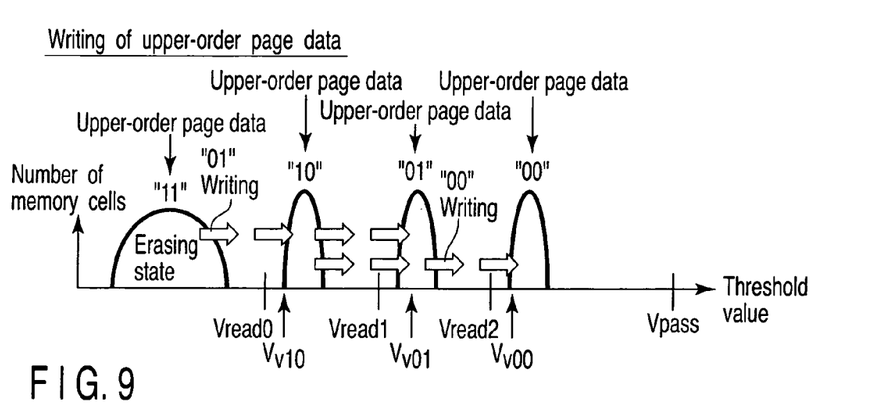
FIG. 9 is a view showing a change in a threshold distribution in the additional writing method.

Then, the upper-order page data is written. As shown in FIG. 9, when both the upper-order page data and the lower-order page data are "1", the erasing state "11" is maintained without shifting a threshold value.

When the upper-order page data is "0" and the lower-order page data is "1", an electron is injected into a floating gate of a memory cell which is in the erasing state "11", whereby a threshold value of the memory cell is increased from the erasing state "11" to a writing state "01" ("01" writing). The writing state "01" in this example exists between a writing state "10" and a writing state "00".

When the upper-order page data is "1" and the lower-order page data is "0", a threshold value is not shifted. The writing state "10 (=x0)" is maintained. The writing state "10" in this example exists between an erasing state "11" and a writing state "01".

When both the upper-order page data and the lower-order page data are "0", an electron is injected into a floating gate of a memory cell which is in the writing state "10 (=x0)", whereby a threshold value of the memory cell is increased from the writing state "10 (=x0)" to a writing state "00" ("00" writing).

Figure 10:
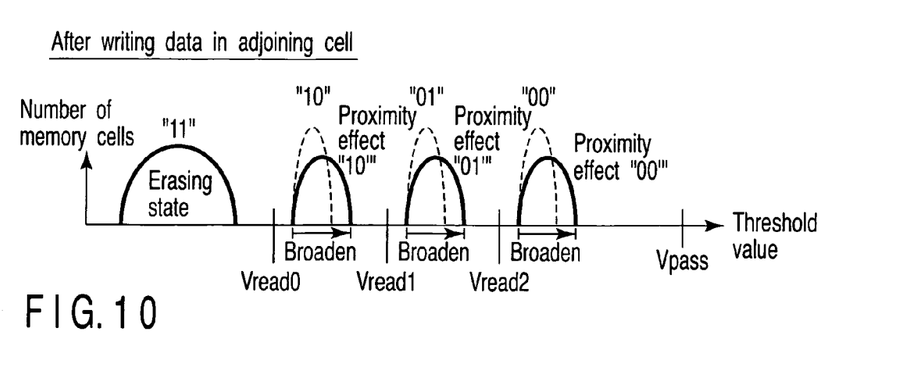
FIG. 10 is a view showing an change in a threshold distribution in the additional writing method.

Then, the upper-order page data and the lower-order page data are written in an adjoining cell. At this time, as shown in FIG. 10, the proximity effect occurs in a memory cell in which the upper-order page data and the lower-order page data have been previously written. The writing state "10" is changed to a writing state "10'", the writing state "01" is changed to a writing state "01'", and the writing state "00" is changed to a writing state "00'". Each threshold distribution width expands to increase a threshold value.

Figure 11:
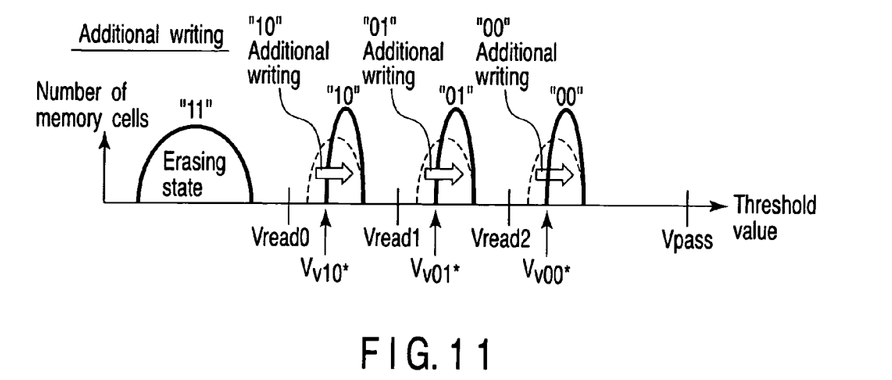
FIG. 11 is a view showing a change in a threshold distribution in the additional writing method.

Then, additional writing is performed with respect to the memory cell in which the proximity effect has occurred. As shown in FIG. 11, a threshold value of the memory cell is respectively increased from the writing state "10'" to a writing state "10", from the writing state "01'" to a writing state "01" and from the writing state "00'" to a writing state "00". Additional writing is particularly different from the lower-order and upper-order page data writing shown in, e.g., FIGS. 8 and 9 in that a verify read voltage Vv supplied to the word line is high. For example, a verify read voltage Vv10* which determines an additional writing state "10" is higher than a verify read voltage Vvx0 which determines the writing state "x0" depicted in FIG. 8. Likewise, a verify read voltage Vv01* which determines an additional writing state "01" is higher than a verify read voltage Vv01 which determines the writing state "01" shown in FIG. 9, and a verify read voltage Vv00* which determines an additional writing state "00" is higher than a verify read voltage Vv00 which determines the writing state "00" illustrated in FIG. 9. Additional writing is not performed in a typical multivalued flash memory. It is writing newly added in order to correct the proximity effect. Using additional writing can likewise correct a threshold fluctuation due to the proximity effect.

The second correction technique shown in FIGS. 8 to 11 will be referred to as an additional writing method in this specification.

Embodiments according to the present invention will now be described hereinafter with reference to the accompanying drawings. It is to be noted that like reference numerals denote like parts throughout the drawings.

First Embodiment

Figure 12:
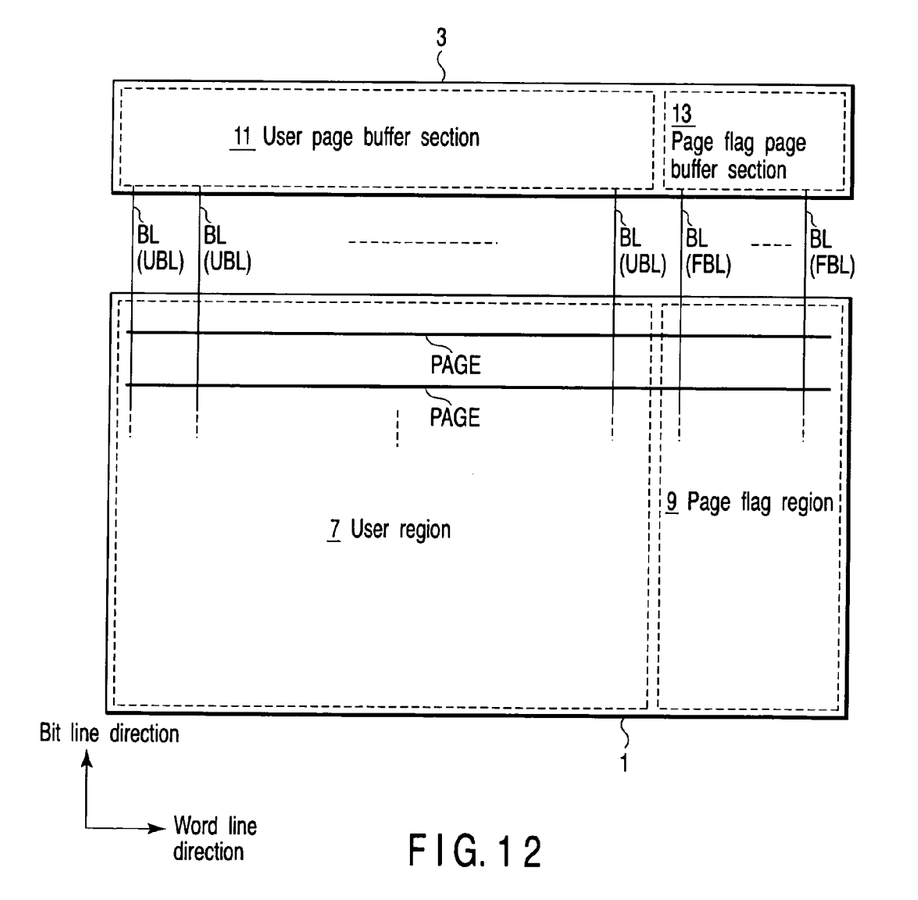
FIG. 12 is a block diagram showing an example of a non-volatile semiconductor memory according to a first embodiment of the present invention.

In the LM writing method and the additional writing method, data indicative of a current state of a page (which will be referred to as page flag data in this specification) is used. The page flag data is recorded by using, e.g., one bit or several bits in one page. FIG. 12 is a block diagram showing an example of a non-volatile semiconductor memory according to the first embodiment.

As shown in FIG. 12, a non-volatile semiconductor memory according to the first embodiment includes a memory cell array 1, a page buffer 3 and bit lines BL.

Figure 13:
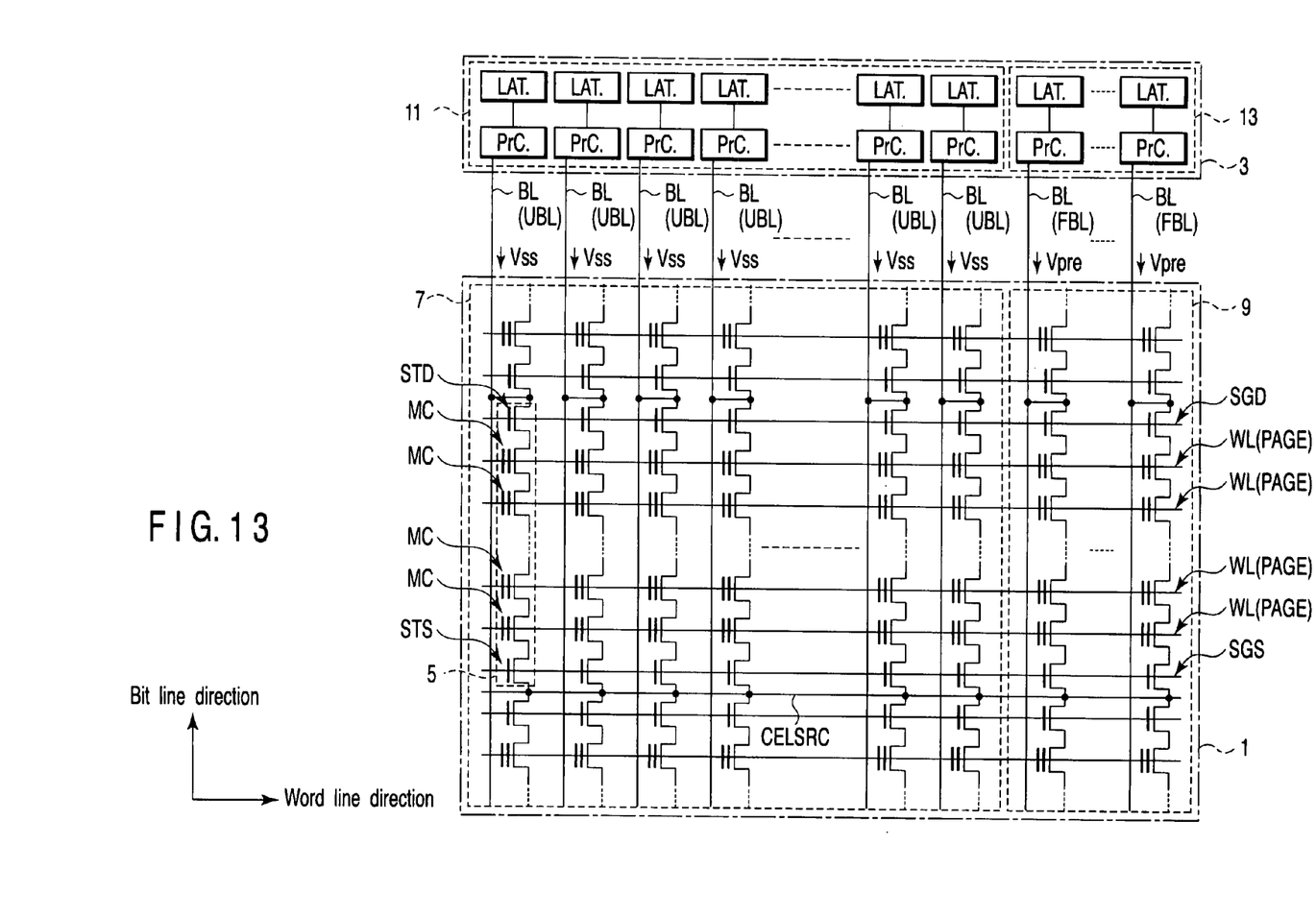
FIG. 13 is a view showing a structural example of a memory cell array and a page buffer depicted in FIG. 12.

Non-volatile semiconductor memory cells are arranged in the memory cell array 1, and includes a plurality of pages (PAGE). The page buffer 3 temporarily holds data in units of page read from the memory cell array 1 and data in units of page which is written in the memory cell array 1. FIG. 13 shows a structural example of the memory cell array 1 and the page buffer 3. As shown in FIG. 13, an example of the non-volatile semiconductor memory is a NAND type flash memory. The NAND type flash memory includes NAND type unit cells 5 as non-volatile semiconductor memory cells. The NAND type unit cell 5 includes a drain-side block selection transistor STD, a source-side block selection transistor STS and a plurality of memory cell transistors MC. The plurality of memory cell transistors MC are connected in series between one end of a current path of the block selection transistor STD and one end of a current path of the block selection transistor STS. The memory cell transistor MC is a threshold variable insulating gate type field-effect transistor having a floating gate as an electric charge layer. The other end of the current path of the drain-side block selection transistor STD is connected with the bit line BL. The other end of the current path of the source-side block selection transistor STS is connected with a cell source line CELSRC. A gate of the drain-side block selection transistor STD is connected with a drain-side block selection line SGD, and a gate of the source-side block selection transistor STS is connected with a source-side block selection line SGS. A gate of the memory cell transistor MC is connected with a word line WL.

In this example, data reading and data writing are simultaneously carried out with respect to the plurality of memory cell transistors MC connected with one word line WL. In a case where one memory cell transistor MC stores data consisting of one bit, the plurality of memory cell transistors MC constitute a unit called a page (PAGE), as shown in FIG. 12. One page refers to the minimum unit for data reading and data writing. In a case where one memory cell transistor MC stores data consisting of two bits (a four-valued memory), the plurality of memory cell transistors store data corresponding to two pages. In this example, the plurality of memory cell transistors MC connected with one word line WL constitute a unit called a page. However, the bit lines BL may be divided into, e.g., even-numbered bit lines and odd-numbered bit lines, and the page may be constituted by using ½ of the plurality of memory cell transistors MC connected with one word line WL.

Each of the plurality of pages includes a user region 7 and a page flag region 7. The user region 7 is a region to which a user can access and in which data can be rewritten by a user. Write data which is input to the NAND type flash memory is stored in the user region 7, and read data output from the NAND type flash memory is read from the user region 7. The page flag region 9 is a region in which page flag data indicative of a current state of a corresponding page is written. The page flag region 9 is a region to which a user cannot access.

The page buffer 3 includes a user page buffer section 11 and a page flag page buffer section 13. The user page buffer section 11 temporarily holds data which is written in the user region 7 and data which is read from the user region 7 (user data). The page flag page buffer section 13 temporarily holds page flag data which is written in the page flag region 9 and read from the page flag region 9.

Figure 14:
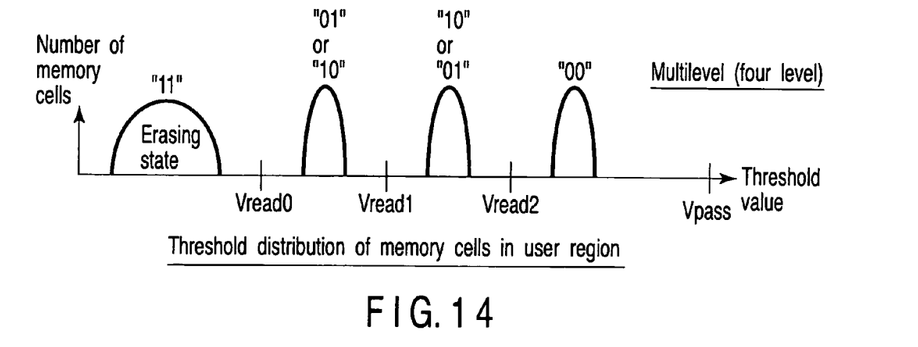
FIG. 14 is a view showing an example of threshold distributions of memory cells in a user region.
Figure 15:
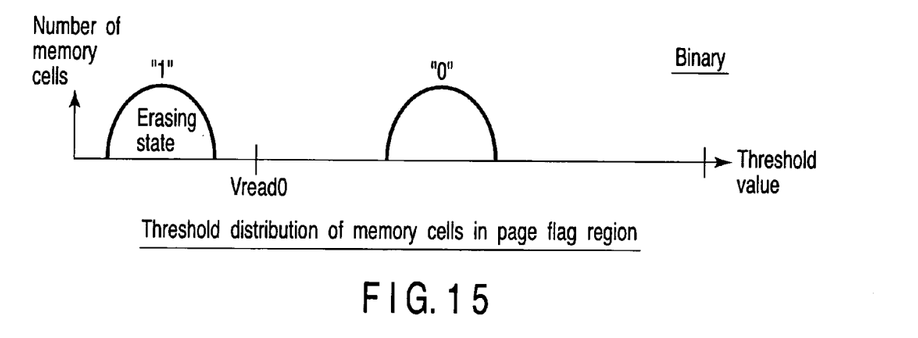
FIG. 15 is a view showing an example of threshold distributions of memory cells in a page flag region.

In this example, user data is recorded in the form of mulutilevel in the non-volatile semiconductor memory cells arranged in the user region 7, and page flag data is stored in the form of two levels in the non-volatile semiconductor memories arranged in the page flag region 9. FIG. 14 shows an example of threshold distributions of memory cells in the user region 7, and FIG. 15 shows an example of threshold distributions of memory cells in the page flag region 9.

The page flag data is data indicative of a current state of a page. The data indicative of a current state of a page means, e.g., data indicating how much writing in a corresponding page has advanced. When the page flag data is read, it is possible to know how much writing in the corresponding page has advanced. Knowing how much writing in the corresponding page has advanced can, e.g., switch verify read voltages. The non-volatile semiconductor memory cell which stores the page flag data will be referred to as a flag cell in this specification.

An initial state of the flag cell is, e.g., data "1" (=an erasing state). This state means a state where writing of lower-order page data is not finished. When page flag data is read from the flag cell and the read data is "1", a current state is a state where writing of lower-order page data is not finished. The verify read voltage is set to the voltage Vvx0 shown in FIG. 5 in the LM writing method and to the voltage Vvx0 depicted in FIG. 8 in the additional writing method.

When writing of the lower-order page data is finished, an electron is injected into a floating gate of the flag cell which is in the erasing state, whereby a threshold value of the flag cell is increased from the erasing state "1" to a writing state "0". When page flag data is read from the flag cell and the read data is "0", it can be understood that a current state is a state where writing of the lower-order page data is finished. The verify read voltage is set to the voltages Vv01, Vv10 and Vv00 shown in FIG. 7 in the LM writing method and to the voltages Vv01 and Vv00 depicted in FIG. 9 in the additional writing method, and upper-order page data is written.

After writing of the upper-order page data is finished, an electron may be injected into a floating gate of another flag cell, thereby increasing a threshold value of this flag cell from the erasing state "1" to the writing state "0". When page flag data is read from another flag cell and the read data is "0", it can be understood that a current state is a state where writing of the upper-order page data is finished. In particular, additional writing is carried out after writing of the upper-order page data is finished in the additional writing method. At the time of additional writing, the verify read voltage is set to the voltages Vv10*, Vv01* and Vv00*. Thus, when page flag data is read from another flag cell and the read data is "0", the verify read voltage is set to the voltages Vv10*, Vv01* and Vv00* depicted in FIG. 11 in the additional writing method.

Figure 16:
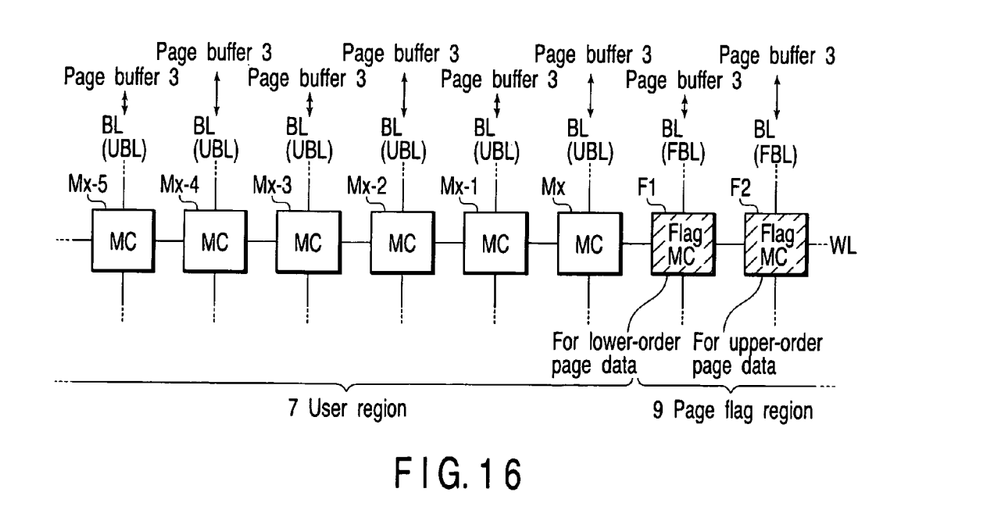
FIG. 16 is a view showing a first example of flag cells.
Figure 17:
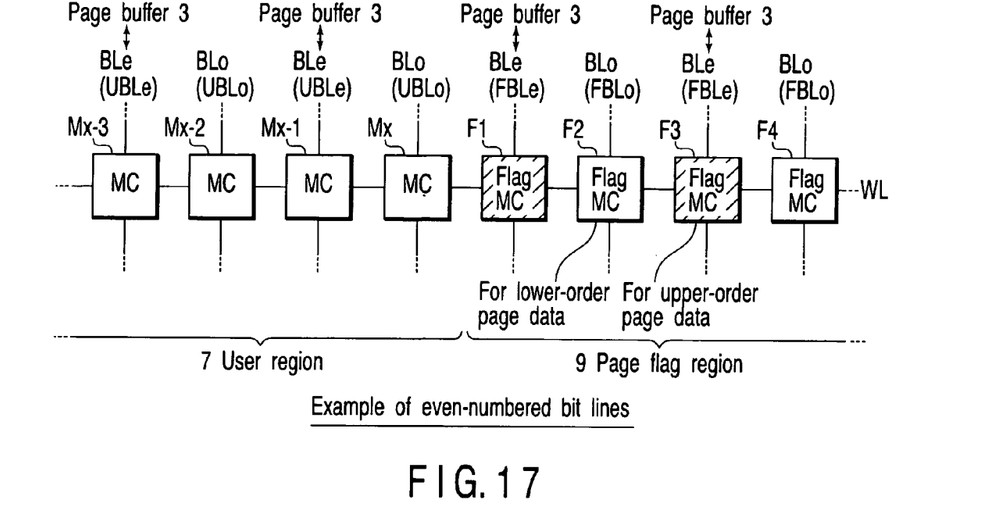
FIG. 17 is a view showing a second example of the flag cells (in case of even-numbered bit lines)
Figure 18:
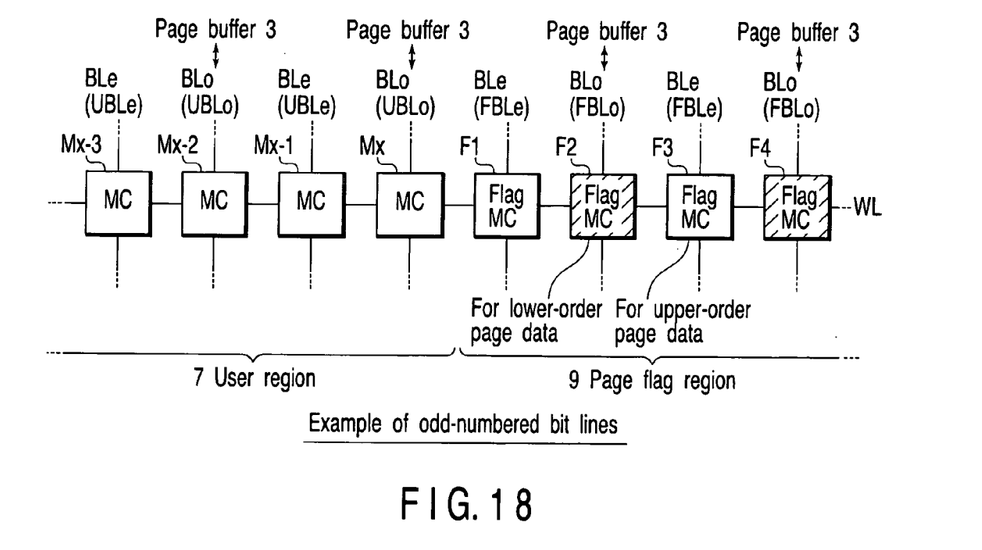
FIG. 18 is a view showing the second example of the flag cells (in case of odd-numbered bit lines)

FIGS. 16 to 18 show examples of the flag cells. FIGS. 16 to 18 show the plurality of memory cell transistors MC connected with one word line WL.

First Example

The first example shown in FIG. 16 is an example where the plurality of memory cell transistors MC connected with one word line WL constitute a page. In the first example, two flag cells connected with one word line WL (F1 and F2 shown in FIG. 16).

The flag cell F1 is used for writing lower-order page data. Data indicating, e.g., whether writing of the lower-order page data is finished is recorded in the flag cell F1. As described above, for example, if data recorded in the flag cell F1 is "1", this means that writing of the lower-order page data with respect to memory cell transistors Mx to Mx-5 connected with the word line WL is not finished. If the data is "0", this means that writing of the lower-order page data with respect to the memory cell transistors Mx to Mx-5 is finished.

The flag cell F2 is used for writing of upper-order page data. Data indicating, e.g., whether writing of the upper-order page data is finished is recorded in the flag cell F2. For example, if data recorded in the flag cell F2 is "1", this means that writing of the upper-order page data with respect to the memory cell transistors Mx to Mx-5, . . . is not finished. If the data is "0", this means that writing of the upper-order page data with respect to the memory cells Mx to Mx-5, . . . is finished.

Second Example

The second example shown in FIGS. 17 and 18 is an example where the half of the plurality of memory cell transistors MC connected with one word line WL is used to constitute a page. In the second example, four flag cells connected with one word line WL are used (F1 to F4 shown in FIG. 16).

FIG. 17 shows an example of a page connected with even-numbered bit lines BLe.

In the case of writing data in a page connected with the even-numbered bit lines BLe, the even-numbered bit lines BLe are connected with the page buffer 3. Odd-numbered bit lines BLo are not connected with the page buffer 3. Of the flag cells F1 to F4, the flag cells F1 and F3 are connected with the page buffer 3. The flag cell F1 is used for writing lower-order page data, and the flag cell F3 is used for writing upper-order page data.

If data recorded in the flag cell F1 is "1", this means that writing of the lower-order page data with respect to the memory cell transistors Mx-1, Mx-3, . . . connected with the word line WL and the even-numbered bit lines BLe is not finished. If the data is "0", this means that writing of the lower-order page data with respect to the memory cell transistors Mx-1, Mx-3, . . . is finished.

Likewise, if data recorded in the flag cell F3 is "1", this means that writing of the upper-order page data with respect to the memory cell transistors Mx-1, Mx-3, . . . is not finished. If the data is "0", this means that writing of the upper-order page data with respect to the memory cell transistors Mx-1, Mx-3, . . . is finished.

FIG. 18 shows an example of a page connected with the odd-numbered bit lines BLo.

In case of writing data in the page connected with the odd-numbered bit lines BLo, the odd-numbered bit lines BLo is connected with the page buffer 3. The even-numbered bit lines BLe are not connected with the page buffer 3. Of the flag cells F1 to F4, the flag cells F2 and F4 are connected with the page buffer 3. The flag cell F2 is used for writing lower-order page data, and the flag cell F4 is used for writing upper-order page data.

If data recorded in the flag cell F2 is "1", this means that writing of the lower-order page data with respect to the memory cell transistors Mx, Mx-2, . . . connected with the word line WL and the odd-numbered bit lines BLo is not finished. If the data is "0", this means that writing of the lower-order page data with respect to the memory cell transistors Mx, Mx-2, . . . is finished.

Likewise, if the data recorded in the flag cell F4 is "1", this means that writing of the upper-order page data with respect to the memory cell transistors Mx, Mx-2, . . . is not finished. If the data is "0", this means that writing of the upper-order data with respect to the memory cell transistors Mx, Mx-2, . . . is finished.

Reading multivalued data takes time as compared with reading two-valued data. That is because reading data from a memory cell is repeated while changing a read voltage supplied to the word line, or a judgment upon read data while changing a reference voltage of a sense amplifier, for example. Reading page flag data from flag cells is an operation added to a writing sequence. Reading page flag data obstructs an increase in the speed of a write operation.

Thus, in the first embodiment, as shown in FIGS. 14 and 15, data is recorded in the form of mulutilevel in memory cells in which user data is written, and data is recorded in the form of two levels in flag cells. As a result, the two-valued data reading method can be utilized for reading page flag data. Therefore, the speed of reading page flag data can be increased as compared with a case where data is recorded in mulutilevel in flag cells.

Further, in the first embodiment, ingenuity is exercised with respect to a page flag data reading method in order to increase the speed of reading page flag data.

As shown in FIG. 13, the page buffer 3 has a latch circuit LAT and a bit line pre-charge circuit PrC in accordance with each bit. These circuits LAT and PrC are provided in both the user page buffer section 11 and the page flag page buffer section 13. The latch circuit LAT is a circuit that temporarily holds data written in a memory cell and data read from a memory cell. The bit line pre-charge circuit PrC is a circuit which supplies a bit line pre-charge potential Vpre to the bit line BL when reading data.

When reading page flag data, the pre-charge circuit PrC of the page flag page buffer section 13 supplies the potential Vpre to the bit line LB which is connected with a flag cell (which will be referred to as FBL for the convenience's sake) to pre-charge the bit line FBL, for example. However, the pre-charge circuit PrC in the user page buffer section 11 does not pre-charge the bit line BL which is connected with a memory cell arranged in the user region 7 (which will be referred to as UBL for the sake of convenience).

For example, as shown in FIGS. 16 to 18, the flag cells share the memory cells MC and the word lines WL arranged in the user region 7. In the case of reading page flag data, when all the bit lines BL (UBL, FBL) are pre-charged, data is also read from the memory cells MC arranged in the user region 7 upon supplying a read voltage Vread to the word lines WL. For example, when the memory cells MC maintain an erasing state, a cell current flows from the bit line BL (UBL) having a pre-charge potential Vpre toward the cell source line CELSRC having an in-circuit ground potential Vss. When the cell current flows through the cell source line CELSRC, the potential of the cell source line CELSRC is temporarily increased. The increased potential of the cell source line CELSRC is then restored to the in-circuit ground potential Vss. In general, this is a phenomenon called cell source line noise. If a large amount of cell current flows through the cell source line CELSRC, the potential of the cell source line CELSRC takes time to be restored to the in-circuit ground potential Vss, and a time margin before shifting to the next operation must be sufficiently assured. This obstructs an increase in speed of reading page flag data.

Thus, in the first embodiment, when reading page flag data, as shown in FIG. 13, the bit line FBL alone is pre-charged, and the bit line UBL is not pre-charged. For example, when reading page flag data, the potential of the bit line UBL is set to be equal to the potential of the cell source line CELSRC. An example of the same potential is the in-circuit ground potential Vss. As a circuit which supplies the in-circuit ground potential Vss to the bit line UBL, the pre-charge circuit PrC can be used, for example. On the other hand, the potential of the bit line FBL is set to the pre-charge potential Vpre which is different from the potential of the cell source line CELSRC.

According to the first embodiment, when reading page flag data, the bit line UBL is not pre-charged. Therefore, for example, the potential of the bit line UBL can be set to the same potential as the potential of the cell source line CELSRC. Even if the read voltage Vread is applied to the word line WL, the cell current does not flow from the bit line UBL toward the cell source line CELSRC. That is, when reading page flag data, the cell current flowing through the cell source line CELSRC is reduced as compared with a case where user data is read. When the cell current is reduced, cell source line noise can be suppressed, and the potential of the cell source line CELSRC is restored to the in-circuit ground potential Vss in a shorter time. The time margin before shifting to the next operation can therefore be decreased. Specifically, the time from reading page flag data to shifting to the next operation can be set to be shorter than the time from reading user data to shifting to the next operation.

As described above, according to the first embodiment, since page flag data is recorded in the forms of two-valued data in each flag cell, page flag data can be read at a high speed as compared with a case where multi-valued data is recorded in each flag cell.

Furthermore, since the bit line FBL alone which is connected with each flag cell is pre-charged when reading page flag data, the time from reading page flag data to shifting to the next operation can be reduced as compared with a case where all the bit lines BL (UBL, FBL) are pre-charged to read page flag data.

Second Embodiment

Figure 19:
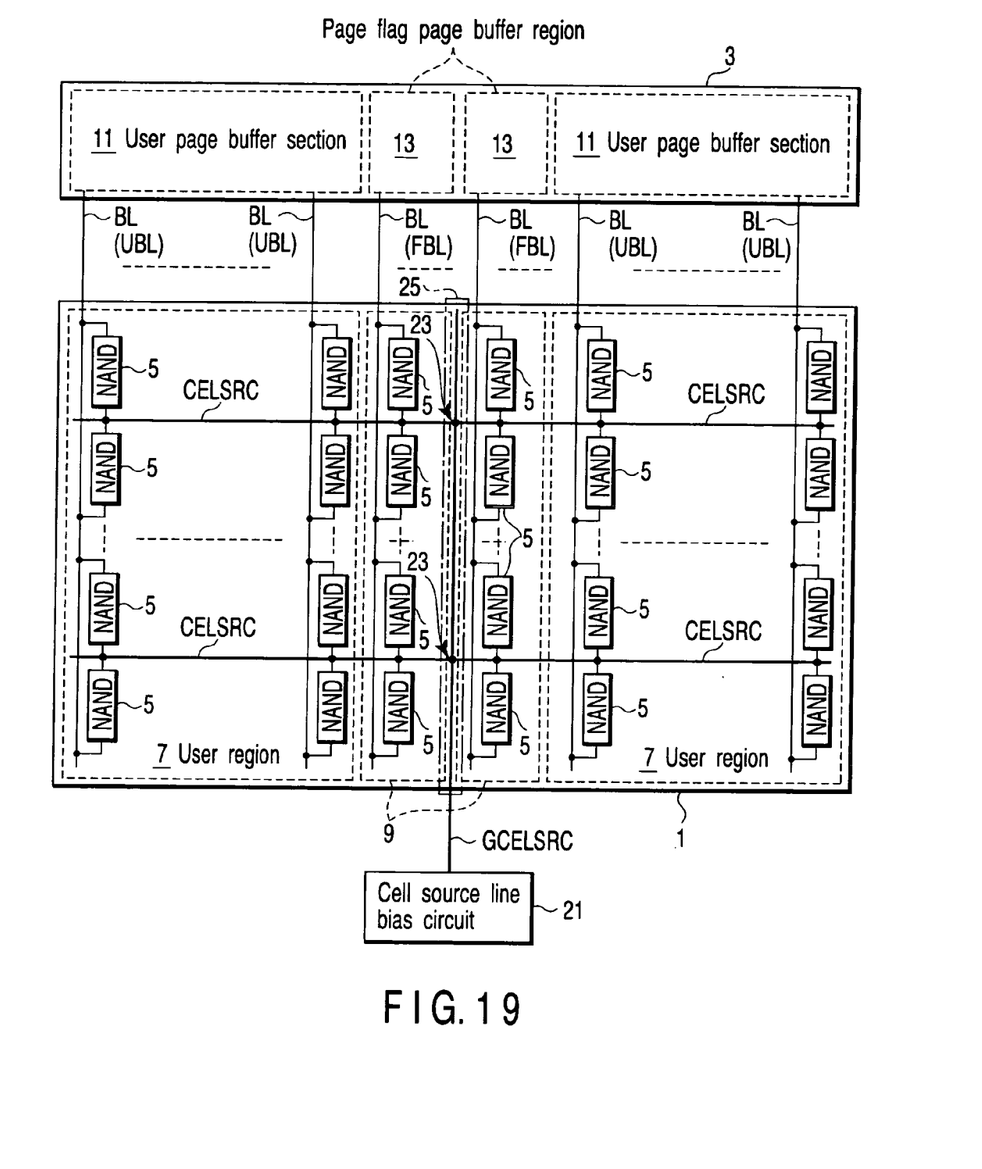
FIG. 19 is a block diagram showing an example of a non-volatile semiconductor memory according to a second embodiment of the present invention.

FIG. 19 is a block diagram showing an example of a non-volatile semiconductor memory according to a second embodiment of the present invention. The second embodiment concerns an arrangement of flag cells.

As shown in FIG. 19, a plurality of cell source lines CELSRC exist in a memory cell 1. That is, the cell source line CELSRC is a local source line. A global source line GCELSRC is provided in order to connect the local source lines with each other. The global source line GCELSRC is connected with a cell source line bias circuit 21 so that a source bias potential output from the cell source line bias circuit 21 is supplied to the local source lines, i.e., the plurality of cell source lines CELSRC. The cell source line bias circuit 21 is arranged outside the memory cell array 1.

The global source line GCELSRC in this example is parallel with bit lines BL. The global source line GCELSRC is formed by utilizing, e.g., an electroconductive layer which is used to form the bit lines BL. Connecting sections which connect the global source line GCELSRC with the cell source lines CELSRC, i.e., plugs 23 in this example are arranged below the global source line GCELSRC. A region where the plugs 23 are arranged will be referred to as a connecting region 25 in this specification.

The cell source line CELSRC is formed of an electroconductive material, e.g., an electroconductive metal having a low resistance. However, its capacitance component and resistance component are not zero. An influence of the cell source line noise described in conjunction with the first embodiment becomes prominent as distanced from each plug 23. The position where the influence of the cell source line noise can be minimized, or position where the influence of the cell source line noise is negligible is close to each plug 23. Thus, in the second embodiment, each page flag region 9 in which flag cells are arranged is adjacent to the connecting region 25.

According to the second embodiment, since each page flag region 9 is adjacent to the connecting region 25, each cell source line CELSRC can be hardly affected by the source line noise or the influence of the source line noise can be reduced when reading page flag data. Therefore, a time from reading page flag data to shifting to the next operation can be further reduced as compared with the first embodiment.

It is to be noted that the second embodiment can be solely carried out, but it can be combined with the first embodiment to be carried out.

Third Embodiment

Figure 20:
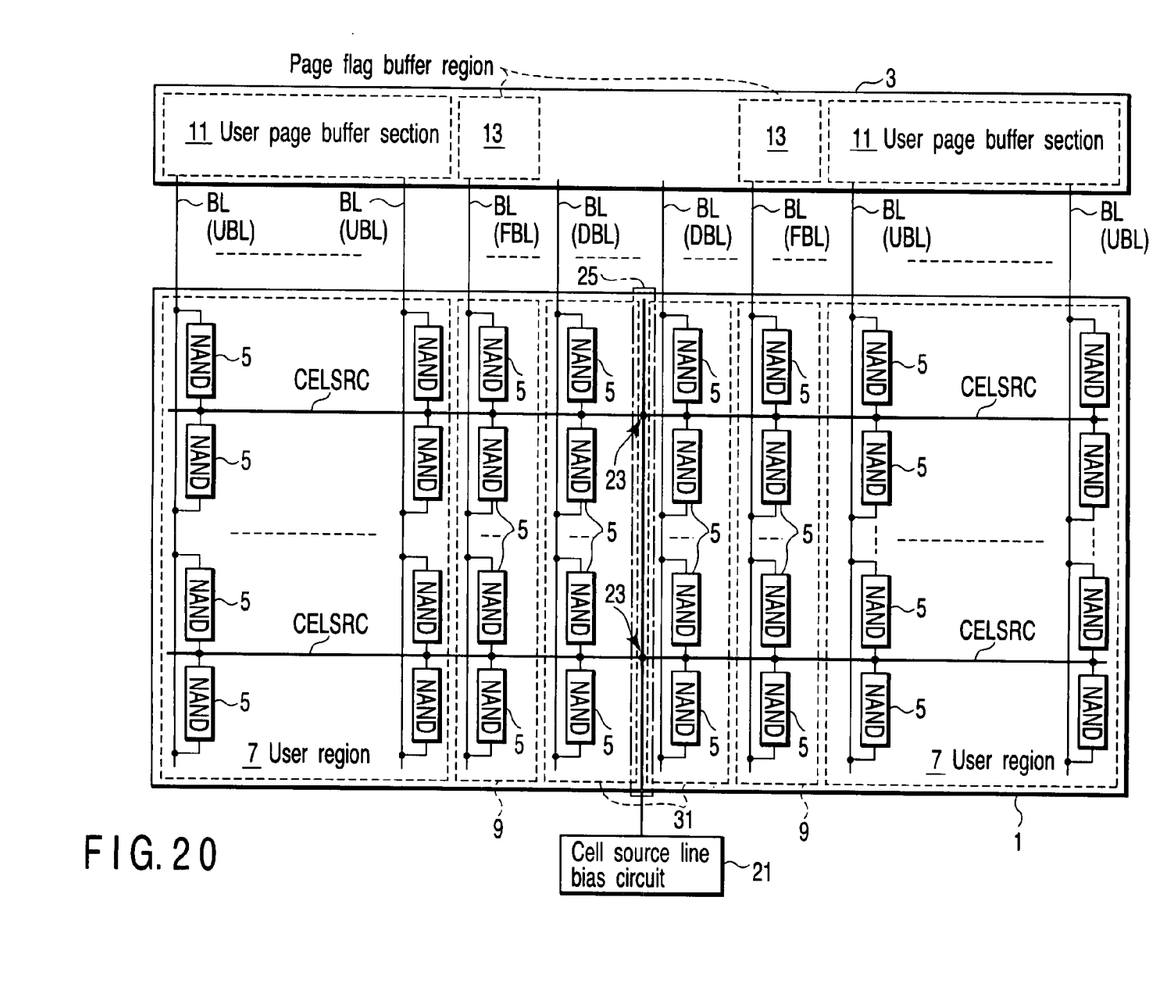
FIG. 20 is a block diagram showing an example of a non-volatile semiconductor memory according to a third embodiment of the present invention.

FIG. 20 is a block diagram showing an example of a non-volatile semiconductor memory according to a third embodiment of the present invention. The third embodiment concerns an arrangement of flag cells like the second embodiment.

As shown in FIG. 20, the third embodiment is different from the second embodiment in that each dummy region 31 is provided between a page flag region 9 and a connecting region 25.

The connecting region 25 may serve as a position where periodicity of a pattern is disrupted in a memory cell array 1. For example, a width of a global source line GCELSRC may be set larger than a width of a bit line BL. That is because increasing a width of the global source line GCELSRC can enlarge a wiring capacity of the global source line GCELSRC itself and suppress a fluctuation in potential. When a width of the global source line GCELSRC is larger than a width of the bit line BL, periodicity of a pattern is disrupted at a position of the global source line GCELSRC. That is, periodicity of the pattern is disrupted at a position of a connecting position 25.

Alternatively, block selection lines SGD and SGS may be set as multiple wiring lines to decrease a resistance value of each of the block selection lines SGD and SGS in some cases. This is a so-called shunt wiring line. A connecting position at which the shunt wiring line is connected with the lowermost block selection line SGD or SGS is formed at the connecting position 25. In this case, likewise, periodicity of a pattern is disrupted at the connecting position 25.

When periodicity of the pattern is disrupted, in the bit line BL which is formed in the vicinity of the global source line GCELSRC, the bit line BL which is narrower or wider than a desired width may be formed in some cases. That is because, when a pattern width (a position where a metal layer remains) or a pitch width (a position where a metal layer is eliminated) of a wiring line is not uniform, a quantity of light which reaches, e.g., a photoresist varies at a lithography step, resulting in an irregular exposure amount. The exposure amount becomes stable when distanced from the global source line GCELSRC to some extent. Thus, the dummy region 31 is set to a position where the exposure amount is stabilized. Although memory cell transistors are formed in the dummy region 31 like other regions, the memory cell transistors formed in the dummy region 31 are not used.

In the third embodiment, the page flag region 9 where flag cells are arranged is adjacent to the dummy region 31.

As described above, in a NAND type flash memory having each dummy region 31 in the memory cell array 1, each page flag region 9 is adjacent to each dummy region 31. As a result, like the second embodiment, the cell source line CELSRC is not affected by source line noise, or an influence of source line noise can be reduced. Therefore, the time from reading page flag data to shifting to the next operation can be further reduced as compared with the first embodiment.

It is to be noted that the third embodiment can be solely carried out, but it may be combined with the first embodiment to be carried out.

Although the above has described the present invention based on some embodiments, the present invention is not restricted to the respective embodiments, and various modifications can be carried out on an embodying stage without departing from the scope of the invention.

Moreover, the respectively embodiments can be solely carried out, but they may be appropriately combined to be carried out.

Additionally, each embodiment includes inventions on various stages, and the invention on various stages can be extracted by appropriately combining a plurality of structural requirements disclosed in each embodiment.

Further, although the present invention has been described based on the example where it is applied to the NAND type flash memory in each embodiment, the present invention is not restricted to the NAND type flash memory, and it can be likewise applied to a flash memory other than the NAND type, e.g., an AND type or an NOR type. Furthermore, a semiconductor integrated circuit device having such a built-in flash memory, e.g., a processor or a system LSI is also included in the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit device comprising:
 a memory cell array which has a non-volatile semiconductor memory arranged therein and includes a plurality of pages, each of the plurality of pages including an user region in which data can be rewritten by an user and a page flag region in which page flag data indicative of a current state of a corresponding page is written;
 a page buffer which temporarily holds data in units of page which is read from the memory cell array and data in units of page which is written in the memory cell array, the page buffer including an user page buffer section which temporarily holds user data which is written in the user region and read from the user region and a page flag page buffer section which temporarily holds page flag data which is written in the page flag region and read from the page flag region, the page flag data being recorded in the form of two levels in the nonvolatile semiconductor memory cell arranged in the page flag region, the user data being recorded in the form of mulutilevel in the non-volatile semiconductor memory cell arranged in the user region; and a plurality of bit lines which electrically connect the page buffer with the memory cell array.

2. The device according to claim 1, wherein each of the user page buffer section and the page flag page buffer section includes a bit line precharge circuit which pre-charges the plurality of bit lines, and when the page flag data is read, the page flag page buffer section pre-charges the bit lines connected with the non-volatile semiconductor memory cell arranged in the page flag region, and the user page buffer section does not precharge the bit lines connected with the nonvolatile semiconductor memory cell arranged in the user region.

3. The device according to claim 2, further comprising:

a plurality of local source lines electrically connected with the plurality of bit lines through a current path of the non-volatile semiconductor memory cell, wherein, when the page flag data is read, a potential of the bit lines connected with the user region is set to the same potential as a potential of the plurality of local source lines, and a potential of the bit lines connected with the page flag region is set to a pre-charge potential different from the potential of the plurality of local source lines.

4. The device according to claim 3, wherein, when the page flag data is read, each of the potential of the plurality of local source lines and the potential of the bit lines connected with the user region is set to an in-circuit ground potential.

5. The device according to claim 4, further comprising:

a global source line which connects the plurality of local source lines with each other; and a connecting region in which connecting sections of the plurality of local source lines and the global source line are arranged, wherein the page flag region is adjacent to the connecting region.

6. The device according to claim 4, further comprising:

a global source line which connects the plurality of local source lines with each other;

a connecting region in which connecting sections of the plurality of local source lines and the global source line are arranged; and a dummy region which is adjacent to the connecting region, wherein the page flag region is adjacent to the dummy region.

7. The device according to claim 3, further comprising:

a global source line which connects the plurality of local source lines with each other; and a connecting region in which connecting sections of the plurality of local source lines and the global o source line are arranged, wherein the page flag region is adjacent to the connecting region.

8. The device according to claim 3, further comprising:

a global source line which connects the plurality of local source lines with each other;

a connecting region in which connecting sections of the plurality of local source lines and the global source line are arranged; and a dummy region which is adjacent to the connecting region, wherein the page flag region is adjacent to the dummy region.

9. The device according to claim 3, wherein, when data is written in the non-volatile semiconductor memory cell, one of an LM writing method and an additional writing method is used.

10. The device according to claim 9, wherein a NAND type unit cell is arranged as the non-volatile semiconductor memory cell in the memory cell array.

11. The device according to claim 3, wherein a NAND type unit cell is arranged as the non-volatile semiconductor memory cell in the memory cell array.

12. The device according to claim 2, wherein, when data is written in the non-volatile semiconductor memory cell, one of an LM writing method and an additional writing method is used.

13. The device according to claim 12, wherein a NAND type unit cell is arranged as the non-volatile semiconductor memory cell in the memory cell array.

14. The device according to claim 2, wherein a NAND type unit cell is arranged as the non-volatile semiconductor memory cell in the memory cell array.

15. The device according to claim 1, wherein, when data is written in the nonvolatile semiconductor memory cell, one of an LM writing method and an additional writing method is used.

16. The device according to claim 15, wherein a NAND type unit cell is arranged as the non-volatile semiconductor memory cell in the memory cell array.

17. The device according to claim 1, wherein a NAND type unit cell is arranged as the non-volatile semiconductor memory cell in the memory cell array.

* * * * *